US009424900B2

(12) United States Patent
Goel et al.

(10) Patent No.: US 9,424,900 B2
(45) Date of Patent: Aug. 23, 2016

(54) AREA-EFFICIENT PROCESS-AND-TEMPERATURE-ADAPTIVE SELF-TIME SCHEME FOR PERFORMANCE AND POWER IMPROVEMENT

(71) Applicant: Avago Technologies General IP (Singapore) Pte. Ltd, Singapore (SG)

(72) Inventors: Ankur Goel, Bangalore (IN); Dharmendra Kumar Rai, Bangalore (IN); Biswa Bhusan Sahoo, Bangalore (IN); Vipin Aryamvalli, Kannur (IN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/510,190

(22) Filed: Oct. 9, 2014

(65) Prior Publication Data
US 2015/0155021 A1  Jun. 4, 2015

(30) Foreign Application Priority Data
Dec. 4, 2013  (IN) ............... 5594/CHE/2013

(51) Int. Cl.
G11C 16/10 (2006.01)
G11C 7/22 (2006.01)
G11C 7/04 (2006.01)
G11C 11/417 (2006.01)

(52) U.S. Cl.
CPC ........ *G11C 7/227* (2013.01); *G11C 7/04* (2013.01); *G11C 11/417* (2013.01)

(58) Field of Classification Search
CPC ................ G11C 11/4091; G11C 16/10
USPC ..................................... 365/207, 185.24
See application file for complete search history.

(56) References Cited

U.S. PATENT DOCUMENTS

| 6,198,670 B1* | 3/2001 | Marr | G11C 11/418 327/512 |
| 6,201,436 B1* | 3/2001 | Hur | G05F 3/245 327/512 |
| 2012/0140576 A1* | 6/2012 | Sim | G11C 29/50 365/189.07 |

* cited by examiner

*Primary Examiner* — Michael Tran

(57) ABSTRACT

In certain embodiments, a method and apparatus for adjusting the timing of a sense-amplifier read operation in an SRAM integrated memory circuit to overcome process-and-temperature variations are disclosed. A charge-injection pull-up transistor is provided to adjust the rate at which a signal line (e.g., a tracking bit line (TBL) and/or a clock signal (e.g., GCLKB)) transitions from one voltage level to another voltage level. A process-and-temperature-dependent bias circuit is provided to control the charge-injection pull-up transistor. The bias circuit causes the charge-injection pull-up transistor to adjust the discharge rate or transition rate of the signal line to compensate for timing delays caused by process or temperature variations.

21 Claims, 5 Drawing Sheets

TABLE 1
SENSE-AMPLIFIER DIFFERENTIAL WITH PROCESS
AND TEMPERATURE USING CONVENTIONAL SCHEME

| PROCESS | TEMPERATURE | SENSE-AMPLIFIER DIFFERENTIAL |
|---------|-------------|------------------------------|
| FAST    | 125         | 65mV                         |
| SLOW    | -40         | 95mV                         |

TABLE 2
SENSE-AMPLIFIER DIFFERENTIAL WITH PROCESS AND
TEMPERATURE USING AN EMBODIMENT OF THE PRESENT INVENTION

| PROCESS | TEMPERATURE | SENSE-AMPLIFIER DIFFERENTIAL |
|---------|-------------|------------------------------|
| FAST    | 125         | 95mV                         |
| SLOW    | -40         | 96mV                         |

AREA-EFFICIENT PROCESS-AND-TEMPERATURE-ADAPTIVE SELF-TIME SCHEME FOR PERFORMANCE AND POWER IMPROVEMENT

CROSS-REFERENCE TO RELATED APPLICATION

This application claims the benefit of Indian Patent Application No. 5594/CHE/2013 filed Dec. 4, 2013, the entire contents of which are incorporated herein by reference.

BACKGROUND OF THE INVENTION

1. Field of the Invention

The present invention relates to integrated circuits, and, more specifically but not exclusively, to a bias circuit for adjusting timing or clock signals in memory circuits.

2. Description of the Related Art

Modern static random-access memory (SRAM) devices include one or more latching differential sense amplifiers that are designed to sense, amplify, and latch a differential bit-line signal from a memory cell. (See, e.g., U.S. Pat. Nos. 5,936,905; 6,738,296 B2; 7,623,400 B2; and 8,279,659 B2 and U.S. Patent Publication No. 2012/0195106 A1, the contents of all of which are hereby incorporated by reference.) The timing of the latch for each sense amplifier is determined by a self-timing pulse (also known as a Sense Amplifier Enable (SAE) signal) generated by a self-timing circuit, which typically includes a tracking word line (TWL) (also known as a dummy word line (DWL)) and a tracking bit line TBL (also known as a dummy bit line DBL) to mimic the signal-propagation delays that may occur on the signal paths to and from the memory cell. When the self-timing pulse arrives at the sense amplifier, the sense amplifier makes a decision based on the differential voltage on its differential inputs, relative to any offset voltage that the amplifier may have, and the decision is latched.

The operation of the sense amplifier, however, is highly sensitive to the timing of the self-timing pulse. If the sense amplifier is triggered too early (i.e., before a large-enough differential signal has developed at its inputs), then the sense amplifier may latch incorrect data. On the other hand, if the sense amplifier is triggered too late (i.e., after developing a larger differential signal on its inputs), then time is unnecessarily wasted, and the memory device operates slowly.

In a memory circuit, a number of different factors may impact the timing of the self-timing pulse for a sense amplifier. For example, the differential inputs of the sense amplifier are connected to a complementary pair of bit lines whose capacitances affect the speed of operation. If, for example, on a particular integrated-circuit die, there is more capacitance on the bit lines than the average expected bit-line capacitance, the signal will develop slower than usual. The sense amplifier must therefore be triggered later than usual. Conversely, for an integrated-circuit die having a lower bit-line capacitance than the average, the sense amplifier can be triggered earlier.

Variations in the size of a memory-cell transistor also impact the speed of operation for the sense amplifier. Because a memory-cell transistor is typically very narrow (e.g., a fraction of a micron), even the smallest variations in the width of the transistor may significantly impact the speed of the circuit. A particularly wide transistor will carry a higher current, which develops a signal on the bit lines faster. A narrower transistor, on the other hand, develops a slower output signal.

Another factor that affects the timing requirements of the sense amplifier is the resistivity of the word line that leads to the memory cells. The word line is frequently made of poly-silicon traces, which may exhibit significant sensitivity to process variations from one integrated-circuit die to another. If a poly-silicon word line has a high resistance, then the signal on that word line will develop more slowly. If the word line has a lower resistance, then the signal will develop more quickly.

To ensure proper operation of the sense amplifier under all process conditions, designers have conventionally been quite conservative in the amount of time by which the sense amplifier trigger signal is delayed. As a result, the access time for the memory circuit is slower than that which would otherwise be possible.

SUMMARY OF THE INVENTION

The present inventors, therefore, have recognized that a need exists for techniques that improve the timing performance of sense amplifiers in memory circuits. In particular, the inventors have recognized that, for a memory circuit (i) manufactured using a "fast" process or (ii) operated at a high temperature, the tracking bit line has a discharge rate that is too high, and the sense-amplifier self-timing pulse therefore tends to arrive at the sense amplifier too early, before the differential bit lines have enough time to develop a valid differential voltage.

Problems in the prior art are addressed in accordance with the principles of the present invention (i) by providing a charge-injection pull-up transistor to adjust the rate at which the tracking bit line discharges and further (ii) by providing a process-and-temperature-dependent bias circuit to control the charge-injection pull-up transistor. The bias circuit produces a bias voltage that depends upon (i) the memory-circuit manufacturing process and (ii) the memory circuit's operating temperature. If the manufacturing process is a "fast" process, or if the operating temperature is high, then the conventional self-timing circuit tends to trigger the sense amplifier too soon. Accordingly, in this circumstance, the bias circuit causes the charge-injection pull-up transistor to allow the tracking bit line to discharge more slowly, which causes the sense amplifier to be triggered later in time and gives the differential bit lines more time to develop a valid voltage. Alternatively, if the manufacturing process is a "slow" process, or if the operating temperature is low, then the conventional self-timing circuit tends to trigger the sense amplifier too late. Accordingly, in this circumstance, the bias circuit causes the charge-injection pull-up transistor to increase the discharge rate of the tracking bit line, and the sense amplifier will be triggered more quickly, thereby overcoming the self-timing delays caused by the process or temperature variations.

In one embodiment, the present invention is a bias circuit for providing a process-or-temperature-dependent bias signal. The bias circuit comprises a first transistor connected to a first supply-voltage source and a current source connected to the first transistor and an output node. The bias circuit further comprises one or more load cells connected to the output node and having a resistance that is at least one of: (i) inversely related to the operating temperature of the bias circuit, and (ii) inversely related to a switching speed of at least the first transistor, wherein the switching speed is a function of a manufacturing process for manufacturing the bias circuit.

In another embodiment, the present invention is a timing circuit for adjusting the timing of a signal on a signal line. The timing circuit comprises a first transistor connected between a first supply-voltage source and the signal line and comprising a first control terminal. The timing circuit further comprises a bias circuit comprising a second transistor. The bias circuit is connected to the first control terminal of the first transistor and is configured to produce a bias voltage that is at least one of: (i) inversely related to the operating temperature of the bias circuit, and (ii) inversely related to a switching speed of at least one of the first transistor and the second transistor, wherein the switching speed is a function of a manufacturing process for manufacturing the timing circuit.

In still another embodiment, the present invention is a method for adjusting the timing of a signal on a signal line. A current is injected onto the signal line via a first transistor connected between a first supply-voltage source and the signal line and comprising a first control terminal. The amount of the injected current is adjusted via a bias circuit comprising a second transistor. The bias circuit is connected to the first control terminal of the first transistor and is configured to produce a bias voltage that is at least one of: (i) inversely related to the operating temperature of the bias circuit, and (ii) inversely related to a switching speed of at least one of the first transistor and the second transistor, wherein the switching speed being is a function of at least a manufacturing process for manufacturing the bias circuit.

BRIEF DESCRIPTION OF THE DRAWINGS

The above embodiment(s) and additional embodiments are described in the following detailed description, the appended claims, and the accompanying drawings in which like reference numerals identify similar or identical elements.

FIG. 5 depicts Tables 1 and 2, which identify exemplary sense-amplifier differential voltages that may result from (i) a conventional self-timing scheme and (ii) a self-timing circuit incorporating a process-and-temperature-dependent bias circuit in accordance with an embodiment of the present invention.

DETAILED DESCRIPTION

Figure 1:
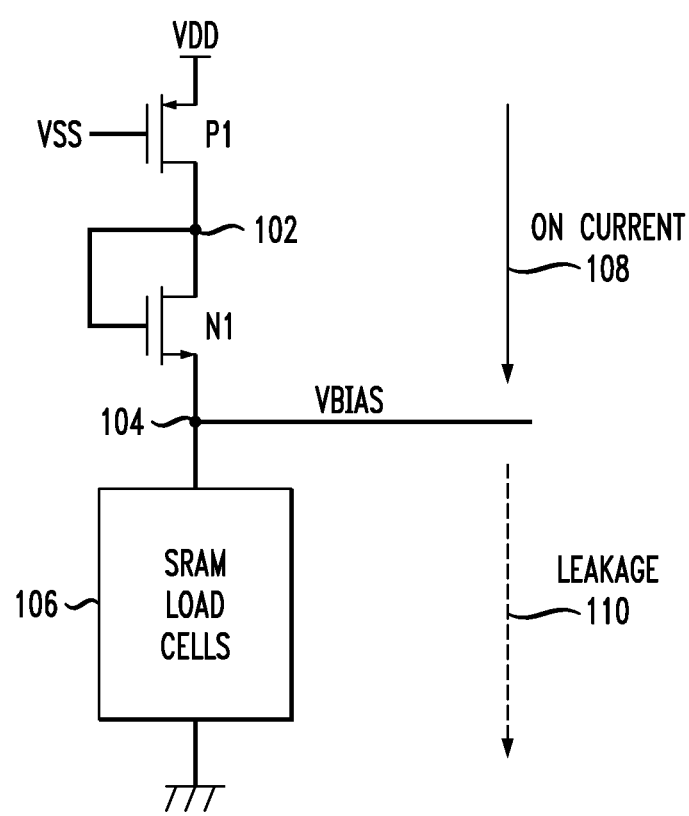
FIG. 1 is a schematic circuit diagram depicting a process-and-temperature-dependent bias circuit in accordance with one embodiment of the present invention.

FIG. 1 depicts bias circuit 100, which comprises P-type transistor P1 having a source terminal connected to a first supply-voltage source (e.g., VDD), a gate terminal connected to a control-voltage source (e.g., supply-voltage source VSS), and a drain terminal connected to node 102. Bias circuit 100 further comprises N-type transistor N1 having a drain terminal connected to node 102, a gate terminal also connected to node 102, and a source terminal connected to node 104. One or more load cells 106 are connected either between node 104 and circuit ground or, alternatively, between node 104 and a second supply-voltage source (e.g., VSS).

Bias circuit 100 operates to produce a process-and-temperature-dependent bias signal VBIAS at node 104 in the following manner. The application of voltage VSS to the gate terminal of transistor P1 tends to cause the transistor to be conductive (or switched "on"). Because the gate and drain terminals of N-type transistor N1 are connected, transistor N1 tends to operate as a constant-current source. Accordingly, the voltage level of bias signal VBIAS at node 104 substantially depends upon the effective resistance of the one or more load cells 106, which resistance is both process-and-temperature dependent. In FIG. 1, the current that is caused to flow through the one or more load cells 106 is shown as leakage current 110, which is substantially equal to the "on" current 108 that passes through transistors P1 and N1. A fast process and/or a higher temperature tends to decrease the effective resistance of the one or more load cells 106 and to increase leakage current 110 through the one or more load cells 106. The voltage level of bias signal VBIAS therefore decreases for a fast process or a higher temperature, e.g., in one embodiment, down to about 400 millivolts for an "FF" process. Conversely, a slow process and/or a lower temperature tends to increase the effective resistance of the one or more load cells 106, and, in certain embodiments, leakage current 110 may even be negligible. Accordingly, the voltage level of bias signal VBIAS increases and approaches a voltage that is near, or even about equal to, supply voltage VDD for a slow process or a low temperature, e.g., in one embodiment, up to about 650 millivolts for an "SS" process.

Thus, in the embodiment depicted in FIG. 1, the voltage level of bias signal VBIAS is: (i) directly related to and dependent on the load-cell resistance, (ii) inversely related to and dependent on the operating temperature of bias circuit 100, (iii) inversely related to and dependent on leakage current 100 through the one or more load cells 106, which is predetermined by the manufacturing process for bias circuit 100 (e.g., a "fast" process or a "slow" process), and (iv) inversely related to the switching speed of one or more transistors in bias circuit 100 or in load cells 106, also as predetermined by the manufacturing process for bias circuit 100.

In the embodiment depicted in FIG. 1, the one or more load cells 106 comprise one or more SRAM load cells having transistors with electrical characteristics similar or identical to transistors contained in one or more SRAM memory cells (not shown) on an integrated circuit (not shown) comprising bias circuit 100. The one or more load cells 106 are not restricted to SRAM load cells, however, and may comprise any load circuit having a process-or-temperature-dependent resistance, e.g., one that decreases with a fast process or a higher temperature and increases with a slow process or a lower temperature.

Figure 2:
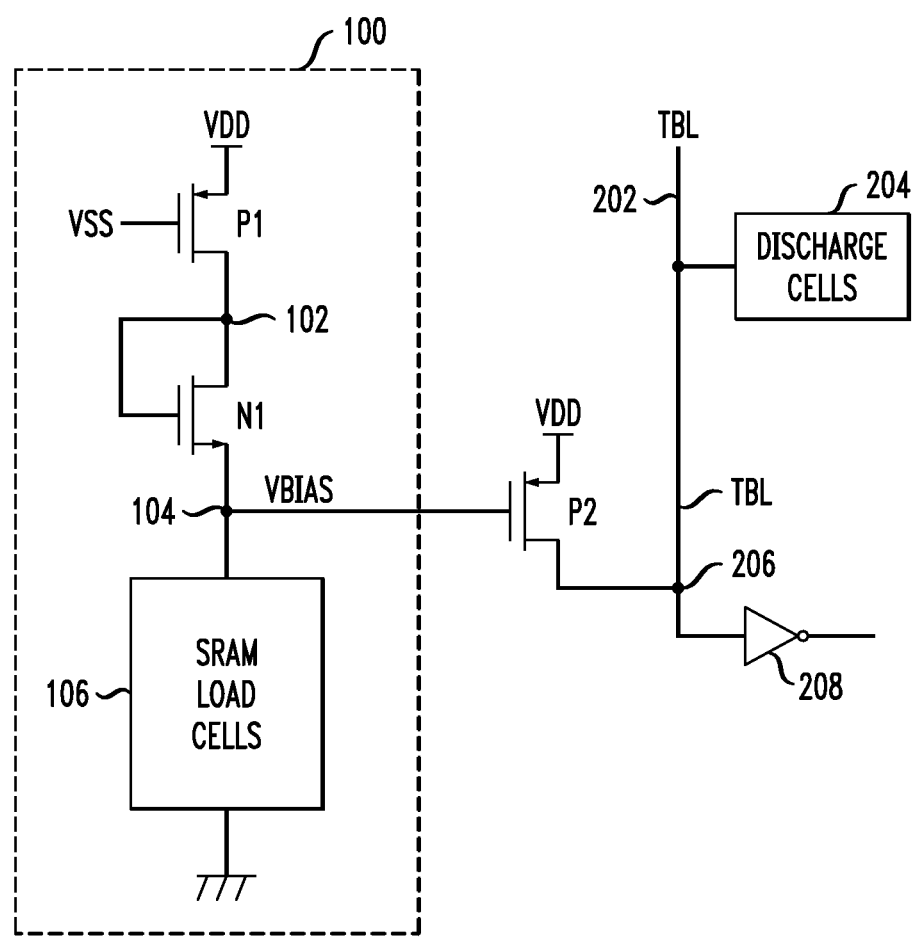
FIG. 2 is a schematic circuit diagram depicting a use of the bias circuit of FIG. 1 to control a discharge rate of a memory-circuit tracking bit line, in accordance with another embodiment of the present invention.

FIG. 2 depicts timing circuit 200, in which bias circuit 100 is applied to control a P-type charge-injection pull-up transistor P2 to adjust a discharge rate of tracking bit line TBL of an integrated memory circuit (not shown). The structure and operation of bias circuit 100 in FIG. 2 is the same as that described above. Timing circuit 200 comprises bias circuit 100, pull-up transistor P2, and discharge cells 204. Output node 104 of bias circuit 100 is connected to a gate terminal of pull-up transistor P2. The source terminal of transistor P2 is connected to the first supply-voltage source (e.g., VDD), and the drain terminal of transistor P2 is connected to the tracking bit line TBL at node 206.

Discharge cells 204 are also connected to tracking bit line TBL. Discharge cells 204 may be any load circuit that permits a flow of current between node 206 and a supply-voltage source (e.g., VDD, VSS, or circuit ground). In certain embodiments, discharge cells 204 comprise SRAM load cells having electrical characteristics similar or identical to one or more SRAM memory cells (not shown) on the integrated memory circuit, which comprises both timing circuit 200 and the one or more SRAM memory cells. As such, the electrical characteristics of discharge cells 204 mimic the electrical characteristics of the one or more SRAM memory cells.

Inverter 208 is also connected to tracking bit line TBL. Inverter 208 is provided as a representative downstream device adapted to receive the tracking-bit-line signal and to perform subsequent processing to generate a self-timing pulse for one or more sense amplifiers (not shown).

As described above, the voltage level of bias signal VBIAS is inversely related to process speed and temperature. Thus, for a fast process and/or a higher temperature, the voltage level of bias signal VBIAS is relatively low. Accordingly, transistor P2 tends to become more conductive and therefore allows at least some current to flow from the first supply-voltage source (e.g., VDD) to the tracking bit line TBL. This current causes a reduction in the discharge rate of the tracking bit line TBL for a fast process and/or a high temperature. The delayed discharge of the tracking bit line TBL then causes a delay in the self-timing pulse produced by a downstream pulse-generation circuit (not shown) adapted to produce the self-timing pulse based on the discharge of the tracking bit line TBL.

Conversely, for a slow process and/or a lower temperature, the voltage level of bias signal VBIAS approaches supply voltage VDD. Accordingly, transistor P2 tends to become less conductive, and, in certain embodiments, current flow through transistor P2 may be completely cut off. As a result, the discharge rate of the tracking bit line TBL for a slow process and/or a low temperature is accelerated and approaches a predetermined maximum discharge rate that is selected to achieve a desired performance for the integrated memory circuit.

Advantageously, timing circuit 200 may be added to conventional SRAM integrated memory circuits that use a tracking bit line, without interfering with the self-time path delay or the sense-amplifier activation delay of those conventional circuits, because little or no current flows through transistor P2 for a slow process or a low temperature.

Figure 3:
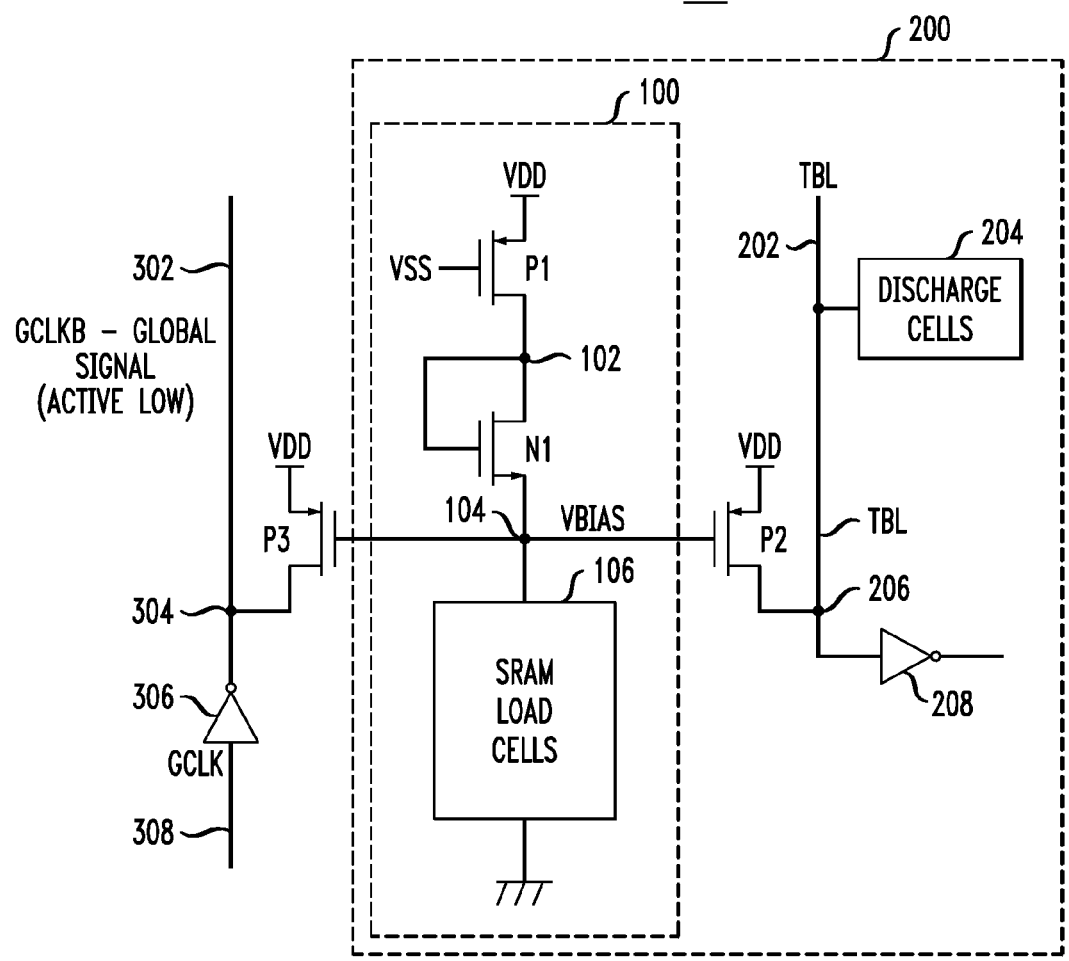
FIG. 3 is a schematic circuit diagram depicting a use of the bias circuit of FIG. 1 to control the discharge rate of the memory-circuit tracking bit line and also to control the timing characteristics of a clock signal of the memory circuit, in accordance with still another embodiment of the present invention.

FIG. 3 depicts timing circuit 300, in which the bias signal VBIAS is used to delay a global clock signal GCLK, in order to further adjust the timing of certain integrated-circuit operations based on process speed and/or operating temperature of timing circuit 300. Timing circuit 300 comprises timing circuit 200 (including bias circuit 100) as well as additional elements. More specifically, an additional P-type charge-injection pull-up transistor P3 is connected to bias circuit 100 and also to a global clock signal GCLKB. A gate terminal of transistor P3 is connected to output node 104 of bias circuit 100, such that the bias signal VBIAS is applied to control transistor P3. A source terminal of transistor P3 is connected to a supply-voltage source (e.g., VDD), and a drain terminal of transistor P3 is connected to node 304 of clock line 302, which carries and inverted global clock signal GCLKB that is "active low". (In other words, the clock signal is deemed to be "active" when it is at a low voltage level.) Accordingly, the timing of global clock signal GCLKB can be delayed by delaying its transition speed, or discharge rate.

The operation of timing circuit 200 (including bias circuit 100) in FIG. 3 is identical to that described above with reference to FIG. 2, and the operation of transistor P3 closely resembles that of transistor P2. For a fast process and/or a higher temperature, the voltage of bias signal VBIAS is relatively low. Accordingly, transistor P3 tends to become more conductive and therefore allows at least some current to flow from the first supply-voltage source (e.g., VDD) to the clock line 302. This current causes a reduction in the discharge rate, and therefore the transition speed, of clock line 302 for a fast process and/or a high temperature.

Conversely, for a slow process and/or a lower temperature, bias signal VBIAS approaches supply voltage VDD. Accordingly, transistor P3 tends to become less conductive, and, in certain embodiments, current flow through transistor P3 may be completely cut off. As a result, the discharge rate of clock line 302 for a slow process and/or a low temperature is accelerated and approaches a predetermined maximum discharge rate (and transition speed) that is selected to achieve a desired performance for the integrated memory circuit.

Advantageously, timing circuit 300 may be added to conventional SRAM integrated memory circuits that use a tracking bit line and an inverted global clock signal, without interfering with the operation of those conventional circuits, because little or no current flows through transistor P2 for a slow process or a low temperature.

Figure 4:
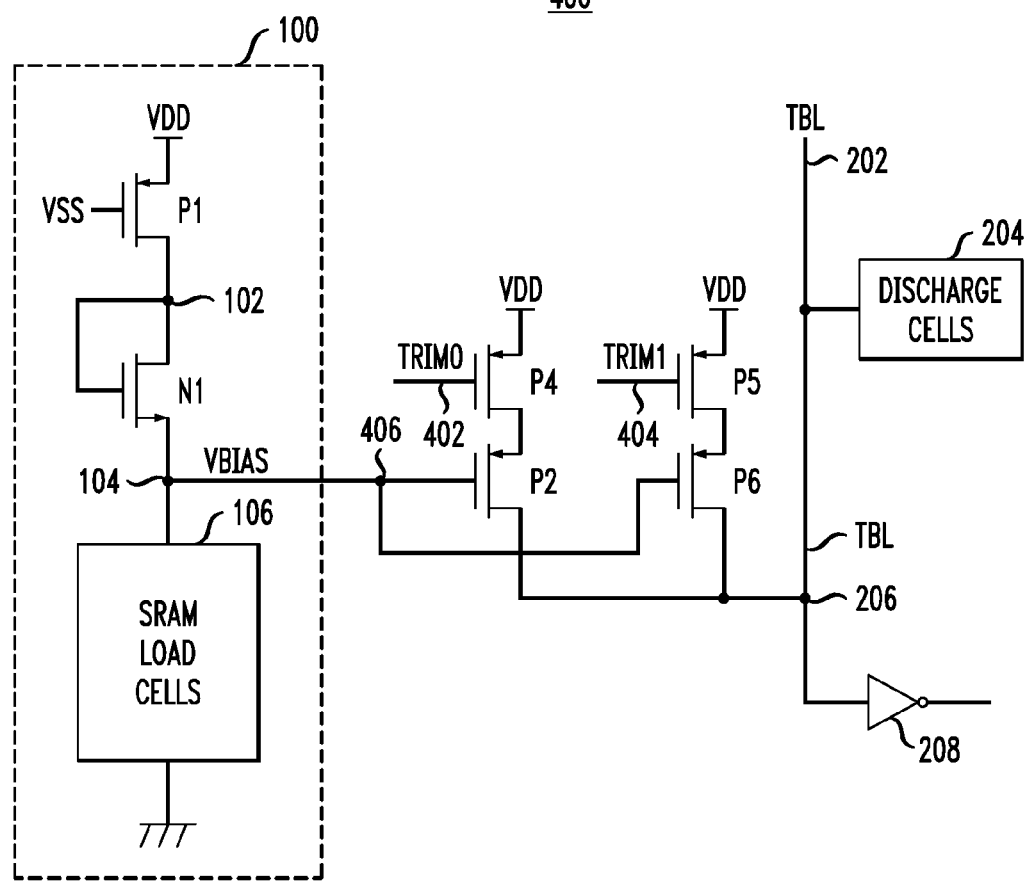
FIG. 4 is a schematic circuit diagram depicting a variation of the embodiment shown in FIG. 2, in accordance with still another embodiment of the present invention.

FIG. 4 depicts timing circuit 400, which incorporates the same elements as timing circuit 200 and also includes three additional P-type transistors: trim transistors P4 and P5 and an additional pull-up transistor P6. Transistor P6 is provided in parallel to transistor P2, and operates identically to it. Trim transistors P4 and P5 are respectively connected (i) between the first supply-voltage source (e.g., VDD) and the source terminal of transistor P2 and (ii) the first supply-voltage source (e.g., VDD) and the source terminal of transistor P6. The parallel current path from the first supply-voltage source through transistor P6 to the tracking bit line TBL helps to provide additional injection current to compensate for larger process-or-temperature variations. In addition, trim transistors P4 and P5 are provided in order to allow on/off control over the injection currents through transistors P2 and P6. Trim transistors P4 and P5 are respectively adapted to receive enable signals TRIM0 and TRIM1, which may be generated by a timing control circuit (not shown) and which may have a voltage level within a range between the voltage of the first supply-voltage source (e.g., VDD) and one of either circuit ground or the voltage of the second supply-volt source (e.g., VSS).

Thus, for example, if enable signals TRIM0 and TRIM1 have a relatively high voltage level of, e.g., voltage VDD, then trim transistors P4 and P5 will be switched off, and no supplemental injection current will be provided to tracking bit line TBL. Accordingly, tracking bit line TBL will discharge at a predetermined and relatively fast rate (e.g., first discharge rate $\Delta V_1/s$). In another example, if enable signal TRIM0 has a low voltage level (e.g., voltage VSS) and enable signal TRIM1 has a high voltage level (e.g., voltage VDD), then trim transistor P4 will be switched "on" and trim transistor P5 will be switched "off". Tracking bit line TBL will therefore discharge at a slower rate (e.g., second discharge rate $\Delta V_2/s$, where $\Delta V_1 > \Delta V_2$). In still another example, if enable signals TRIM0 and TRIM1 both have a low voltage level (e.g., voltage VSS), then both trim transistors P4 and P5 will be switched "on", and tracking bit line TBL will discharge at an even slower rate (e.g., third discharge rate $\Delta V_3/s$, where $\Delta V_2 > \Delta V_3$). In this way, the discharge rate of tracking bit line TBL, and therefore the triggering time of a downstream sense amplifier, can be precisely adjusted (e.g., during testing or during operation) to achieve a desired sense-amplifier timing.

FIG. 5 contains two tables. Table 1 identifies simulated sense-amplifier performance results for a simulated 16-nm, FinFET SRAM memory circuit using a conventional self-timing circuit (Table 1). Table 2 identifies simulated sense-amplifier performance results using a timing circuit according to the embodiment shown in FIG. 3 (Table 2). As shown in Table 1, the simulated sense-amplifier differential input voltage for a fast process and a high temperature of 125° Celsius for a conventional self-timing circuit was 65 millivolts, which fails to satisfy industry-standard performance requirements. (A sense-amplifier differential input voltage of about 100 millivolts is preferred, in order to reliably and accurately identify a "1" memory bit value from a "0" memory bit value.) In contrast, the simulated sense-amplifier differential input voltage for a fast process and a high temperature of 125° Celsius according to one of the above-described embodiments was 95 millivolts.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

Also, for purposes of this description, the term "tracking bit line" refers to any bit line that is used to mimic or track the timing of a signal on a bit line connected to a memory cell of an integrated memory circuit. Thus, the term "tracking bit line," as used herein, is intended to be synonymous with, and to encompass, the term "dummy bit line."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple terminals or devices coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET or FinFET), and the term "control node" refers generically to the gate of the MOSFET. Similarly, as used in the claims, the terms "source," "drain," and "gate" should be understood to refer either to the source, drain, and gate terminals of a MOSFET or to the emitter, collector, and base terminals of a bi-polar device when the present invention is implemented using bi-polar transistor technology.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

We claim:

1. A bias circuit for providing a process-or-temperature-dependent bias signal, the bias circuit comprising:
   a first transistor connected to a first supply-voltage source;
   a current source connected to the first transistor and an output node; and
   one or more load cells connected to the output node and having a resistance that is
   inversely related to a switching speed of at least the first transistor, wherein the switching speed is a function of a manufacturing process for manufacturing the bias circuit.

2. The bias circuit of claim 1, wherein the current source is a constant-current source.

3. The bias circuit of claim 1, wherein the current source comprises a second transistor comprising a drain terminal connected to the first transistor, a gate terminal connected to its drain terminal, and a source terminal connected to the output node.

4. The bias circuit of claim 1, wherein bias circuit is integrated on an integrated memory circuit, and the one or more load cells have electrical characteristics that are similar to one or more memory cells that are also integrated on the integrated memory circuit, such that the electrical characteristics of the one or more load cells mimic the electrical characteristics of the one or more memory cells.

5. The bias circuit of claim 1, wherein the resistance of the one or more load cells is both (i) inversely related to the operating temperature of the bias circuit, and (ii) inversely related to a switching speed of at least one of the first transistor and the second transistor, the switching speed being a function of a manufacturing process for manufacturing the timing circuit.

6. The bias circuit of claim 1, wherein the one or more load cells have a leakage current that is a function of the manufacturing process, and the bias circuit is configured to produce the bias signal as an inversely dependent function of the leakage current.

7. A timing circuit for adjusting the timing of a signal on a signal line, the timing circuit comprising:
a first transistor connected between a first supply-voltage source and the signal line and comprising a first control terminal wherein the first transistor is configured to inject current onto the signal line, such that at least one of (i) a discharge rate of a signal on the signal line and (ii) a transition speed of the signal on the signal line is adjusted based on the voltage; and
a bias circuit comprising a second transistor, wherein the bias circuit is connected to the first control terminal of the first transistor and is configured to produce a bias voltage that is at least one of:
(i) inversely related to the operating temperature of the bias circuit, and
(ii) inversely related to a switching speed of at least one of the first transistor and the second transistor, wherein the switching speed is a function of a manufacturing process for manufacturing the timing circuit.

8. The timing circuit of claim 7, wherein the signal line is a tracking bit line of an integrated memory circuit.

9. The timing circuit of claim 8, wherein:
when the bias circuit produces a first bias voltage, the tracking bit line has a first discharge rate; and
when the bias circuit produces a second bias voltage greater than the first bias voltage, the tracking bit line has a second discharge rate that is less than the first discharge rate.

10. The timing circuit of claim 8, further comprising:
a pulse-generation circuit connected to the tracking bit line; and
a sense amplifier connected to the pulse-generation circuit, wherein:
when the bias circuit produces a first bias voltage, the pulse-generation circuit produces differential sense amplifier receives a self-timing pulse that is delayed by a first delay time, and
when the bias circuit produces a second bias voltage, the differential sense amplifier receives a self-timing pulse that is one of (i) not substantially delayed and (ii) delayed by a second delay time that is less than the first delay time.

11. The timing circuit of claim 7, further comprising:
a third transistor connected between a third supply-voltage source and a second signal line and comprising a second control terminal connected to the bias circuit and configured to receive the bias voltage.

12. The timing circuit of claim 11, wherein:
the second signal line is a clock line;
the second signal is a clock signal of the integrated memory circuit; and
the third transistor is configured to inject current onto the second signal line, such that the transition speed of the clock signal is adjusted based on the bias voltage.

13. The timing circuit of claim 7, wherein:
the signal line is a clock line;
the signal is a clock signal of an integrated memory circuit; and
the first transistor is configured to inject current onto the signal line, such that the transition speed of the clock signal is adjusted based on the bias voltage.

14. The timing circuit of claim 7, wherein the bias voltage is both:
(i) inversely related to the operating temperature of the bias circuit, and
(ii) inversely related to the switching speed of at least one of the first transistor and the second transistor.

15. The timing circuit of claim 7, further comprising:
at least two trim transistors; and
a pull-up transistor connected in parallel to the second transistor and also connected to a drain of one of the at least two trim transistors.

16. A method for adjusting the timing of a signal on a signal line, the method comprising:
injecting a current onto the signal line via a first transistor connected between a first supply-voltage source and the signal line and comprising a first control terminal; and
adjusting the amount of the injected current via a bias circuit comprising a second transistor, wherein the bias circuit is connected to the first control terminal of the first transistor and is configured to produce a bias voltage that is at least one of:
(i) inversely related to the operating temperature of the bias circuit, and
(ii) inversely related to a switching speed of at least one of the first transistor and the second transistor, wherein the switching speed is a function of a manufacturing process for manufacturing the bias circuit.

17. The method of claim 16, wherein injecting a current onto the signal line causes at least one of (i) a discharge rate of a signal on the signal line and (ii) a transition speed of the signal on the signal line to be adjusted based on the bias voltage.

18. The method of claim 16, wherein:
the signal line is a tracking bit line on an integrated memory circuit;
the signal is a tracking-bit-line signal.

19. The method of claim 18, further comprising:
generating a self-timing pulse based on a voltage level of the tracking-bit-line signal; and
providing the self-timing pulse to a sense amplifier, wherein:
when the bias circuit produces a first bias voltage, the self-timing pulse is delayed by a first delay time, and
when the bias circuit produces a second bias voltage greater than the first bias voltage, the self-timing pulse is one of (i) not substantially delayed and (ii) delayed by a second delay time that is less than the first delay time.

20. The method of claim 18, further comprising injecting a current onto a second signal line via a third transistor connected between a second supply-voltage source and the second signal line and comprising a second control terminal connected to the bias circuit and configured to receive the bias voltage.

21. The method of claim 20, wherein:
the second signal line is a clock line;
the second signal is a clock signal of the integrated memory circuit; and
the transition speed of the clock signal is adjusted based on the bias voltage.

* * * * *